US012733334B2

(12) United States Patent
Adachi et al.

(10) Patent No.: US 12,733,334 B2
(45) Date of Patent: Sep. 8, 2026

(54) LIGHT-EMITTING ELEMENT, DISPLAY DEVICE, AND METHOD FOR MANUFACTURING LIGHT-EMITTING ELEMENT

(71) Applicant: SHARP KABUSHIKI KAISHA, Sakai City (JP)

(72) Inventors: Kota Adachi, Sakai City (JP); Yasushi Asaoka, Sakai City (JP)

(73) Assignee: SHARP KABUSHIKI KAISHA, Sakai City (JP)

( * ) Notice: Subject to any disclaimer, the term of this patent is extended or adjusted under 35 U.S.C. 154(b) by 360 days.

(21) Appl. No.: 18/560,922

(22) PCT Filed: Jul. 13, 2021

(86) PCT No.: PCT/JP2021/026262

§ 371 (c)(1),
(2) Date: Nov. 14, 2023

(87) PCT Pub. No.: WO2023/286148

PCT Pub. Date: Jan. 19, 2023

(65) Prior Publication Data

US 2024/0284698 A1 Aug. 22, 2024

(51) Int. Cl.
*H10K 50/15* (2023.01)
*H10K 50/115* (2023.01)
(Continued)

(52) U.S. Cl.
CPC .......... *H10K 50/15* (2023.02); *H10K 50/115* (2023.02); *H10K 85/111* (2023.02);
(Continued)

(58) Field of Classification Search
CPC .... H10K 50/15; H10K 50/115; H10K 85/111; H10K 85/115; H10K 85/151;
(Continued)

(56) References Cited

U.S. PATENT DOCUMENTS

2019/0288225 A1* 9/2019 Chen .................... H10K 50/115
2020/0083450 A1* 3/2020 Han .................... H10K 85/633
(Continued)

FOREIGN PATENT DOCUMENTS

JP 2014063699 A * 4/2014
JP 2017045889 A * 3/2017
JP 2020-077610 A 5/2020

*Primary Examiner* — Shahan Ur Rahaman
(74) *Attorney, Agent, or Firm* — ScienBiziP, P.C.

(57) ABSTRACT

A light-emitting element includes: a first electrode; a second electrode; a light-emitting layer positioned between the first electrode and the second electrode, and containing quantum dots and a first hole transport material; and a hole transport layer positioned between the first electrode and the light emitting layer, and containing a second hole transport material solubility of which to a solvent in which the quantum dots are soluble is lower than solubility of the first hole transport material. A difference in ionization potential between the second hole transport material and the first hole transport material is smaller than a difference in ionization potential between the second hole transport material and the quantum dots.

15 Claims, 2 Drawing Sheets

(51) Int. Cl.
*H10K 85/10* (2023.01)
*H10K 101/00* (2023.01)
*H10K 101/30* (2023.01)

(52) U.S. Cl.
CPC .......... *H10K 85/115* (2023.02); *H10K 85/151* (2023.02); *H10K 2101/30* (2023.02); *H10K 2101/80* (2023.02)

(58) Field of Classification Search
CPC ........... H10K 2101/30; H10K 2101/80; H05B 33/10; H05B 33/12; H05B 33/14; H05B 33/22
See application file for complete search history.

(56) References Cited

U.S. PATENT DOCUMENTS

2020/0212333 A1 7/2020 Han et al.
2021/0273190 A1 9/2021 Han et al.

* cited by examiner

LIGHT-EMITTING ELEMENT, DISPLAY DEVICE, AND METHOD FOR MANUFACTURING LIGHT-EMITTING ELEMENT

TECHNICAL FIELD

The disclosure relates to a light-emitting element, a display device, and a method for manufacturing the light-emitting element.

BACKGROUND ART

Patent Documents 1 and 2 are each directed to a multilayer injection-electroluminescence light-emitting element, and disclose that a hole transport material is added to a light-emitting layer containing quantum dots in order to increase mobility of holes in the light-emitting layer and to enhance efficiency in injecting the hole into the quantum dots.

CITATION LIST

Patent Literature

[Patent Document 1] Japanese Unexamined Patent Application Publication No. 2020-077610

[Patent Document 2] United States Patent Application Publication No. 20190288225

SUMMARY

Technical Problem

In forming the light-emitting layer in which the hole transport material is added to the quantum dots as described in Patent Documents 1 and 2, interfacial mixing of the hole transport material occurs between the light-emitting layer and a hole transport layer adjacent to the light-emitting layer. As a result, the interface between the light-emitting layer and the hole transport layer becomes rough, which might deteriorate characteristics of the light-emitting element.

Solution to Problem

In order to solve the above problem, a light-emitting element according to an aspect of the disclosure includes: a first electrode; a second electrode; a light-emitting layer positioned between the first electrode and the second electrode, and containing a plurality of quantum dots and a first hole transport material; and a hole transport layer positioned between the first electrode and the light-emitting layer, and containing a second hole transport material solubility of which to a solvent in which the quantum dots are soluble is lower than solubility of the first hole transport material. A difference in ionization potential between the second hole transport material and the first hole transport material is smaller than a difference in ionization potential between the second hole transport material and the quantum dots.

Advantageous Effects of Disclosure

An embodiment of the disclosure can provide a light-emitting element that improves in hole injection efficiency, successfully reduces roughness of an interface between a hole transport layer and a light-emitting layer, and simultaneously achieves excellent hole transportability and interfacial properties.

DESCRIPTION OF EMBODIMENTS

First Embodiment

Figure 1:
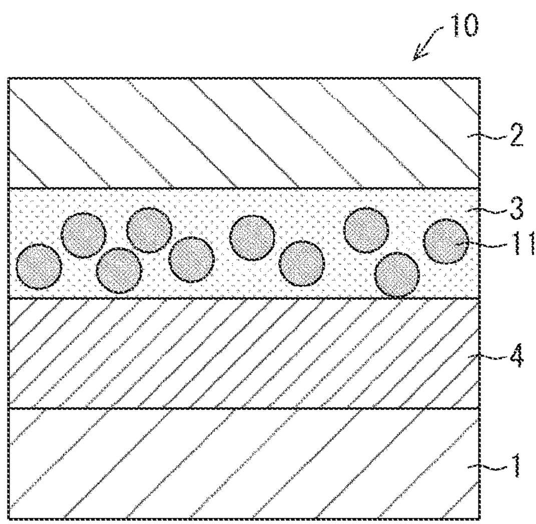
FIG. 1 is a schematic cross-sectional view of a light-emitting element according to a first embodiment of the disclosure.

FIG. 1 is a schematic cross-sectional view of a light-emitting element 10 according to this embodiment. As illustrated in FIG. 1, the light-emitting element 10 according to this embodiment includes: a first electrode 1; a second electrode 2; a light-emitting layer 3 positioned between the first electrode 1 and the second electrode 2; and a hole transport layer 4 positioned between the first electrode 1 and the light-emitting layer 3. In other words, the light-emitting element 10 includes the hole transport layer 4, the light-emitting layer 3, and the second electrode 2, all of which are provided above the first electrode 1 in the stated order. The light-emitting layer 3 contains: a plurality of quantum dots 11; and a first hole transport material. Furthermore, the hole transport layer 4 contains a second hole transport material solubility of which to a solvent in which the quantum dots are soluble is lower than solubility of the first hole transport material, a difference in ionization potential between the second hole transport material and the first hole transport material being smaller than a difference in ionization potential between the second hole transport material and the quantum dots.

The light-emitting element 10 according to this embodiment excels in hole injection efficiency and reduces roughness of the interface between the hole transport layer 4 and the light-emitting layer 3, thereby having an advantageous effect of simultaneously achieving excellent hole transportability and interfacial properties.

Note that, in this Description, the direction from the light-emitting layer 3 toward the first electrode 1 of the light-emitting element layer 10 is referred to as a "downward direction", and the direction opposite to the downward direction is referred to as an "upward direction".

First Electrode and Second Electrode

The first electrode (an anode) 1 and the second electrode (a cathode) 2 contain a conductive material, and respectively and electrically connected to the hole transport layer 4 and the light-emitting layer 3. Either the first electrode 1 or the second electrode 2 is a transparent electrode. The transparent electrode may be formed of, for example, ITO, IZO, ZnO, AZO, BZO or FTO, and deposited by, for example, sputtering. Furthermore, either the first electrode 1 or the second electrode 2 may contain a metal material. As the metal material, Al, Cu, Au, Ag, or Mg is preferable because these metal materials are highly reflective to visible light. Such metal materials may be used either alone or as an alloy.

Light-Emitting Layer

The light-emitting layer 3 contains the plurality of quantum dots (semiconductor nanoparticles) 11. In particular, in this embodiment, the light-emitting layer 3 contains: the plurality of quantum dots 11; and the first hole transport material. When the light-emitting layer 3 contains the first hole transport material, advantageous effects are obtained as follows: (i) mobility of the holes in the light-emitting layer 3 can be increased, so that the hole can be injected more efficiently into the quantum dots 11; and (ii) compared with a case where the light-emitting layer 3 does not contain the first hole transport material, an energy barrier between the light-emitting layer 3 and the hole transport layer 4 is small, so that the holes can be injected at a lower voltage. The light-emitting layer 3 has a thickness of preferably 5 to 50 nm.

In light-emitting layer 3, a content of the quantum dots 11 is preferably larger than a content of the first hole transport material.

Specifically, when the total amount of the quantum dots 11 and the first hole transport material contained in the light-emitting layer 3 is 100 mass %, the content of the quantum dots 11 in the light-emitting layer 3 is preferably more than 50 mass %. Furthermore, the content of the quantum dots 11 in the light-emitting layer 3 is more preferably 75 mass % or more, and still more preferably 85 mass % or more. Such features can provide the light-emitting layer 3 with sufficient emission intensity.

Moreover, when the total amount of the quantum dots 11 and the first hole transport material contained in the light-emitting layer 3 is 100 mass %, an upper limit value of the content of the quantum dots 11 in the light-emitting layer 3 is preferably 99 mass % or less. In addition, the upper limit value of the content of the quantum dots 11 in the light-emitting layer 3 is more preferably 95 mass % or less, and still more preferably 90 mass % or less. Such features can sufficiently increase the mobility of the holes in the light-emitting layer 3.

The light-emitting layer 3 is formed of a quantum-dot-dispersed solution in which the plurality of quantum dots 11 and the first hole transport material are dispersed in a solvent. The quantum-dot-dispersed solution is applied to the hole transport layer 4 to form the light-emitting layer 3. The quantum-dot-dispersed solution can be applied by various kinds of techniques such as inkjet printing and spin coating.

In Description, the "quantum-dot-dispersed solution" is a liquid formed of a solvent in which quantum dots are soluble. In the solvent, the plurality of quantum dots 11 and the first hole transport material are dissolved or dispersed. The quantum-dot-dispersed solution may contain another component than the quantum dots 11, the first hole transport material, and the solvent. Examples of the other component include ligands coordinated with the surface layers of the quantum dots 11.

In Description, the "solvent in which the quantum dots are soluble" means that 1 g of quantum dots are stably dispersed in 1 to 10 ml of a solvent at ordinary temperature (5 to 35° C.), and no sediment is deposited in the solvent. Such a solvent may be either a nonpolar solvent or a polar solvent commonly used to disperse quantum dots. Examples of the nonpolar solvent include octane, toluene, hexane, tetradecane, and cyclododecane. Examples of the polar solvent include water and PGMEA. These solvents may be used alone or in combination of two or more.

It is preferable to use a nonpolar solvent as the solvent in which the quantum dots are soluble because, in the nonpolar solvent, the first hole transport material exhibits a preferable range of solubility. Furthermore, it is more preferable to use a nonpolar solvent having a dipole moment of 0.4 D (Debye) ($1.33\times10^{-30}$ C·m) or less, and it is still more preferable to use a nonpolar solvent having a dipole moment of 0.2 D ($0.667\times10^{-30}$ C·m) or less because, in such a nonpolar solvent, the second hole transport material exhibits a preferable range of insolubility. Thus, in the selected solvent, the quantum dots and the first hole transport material efficiently dissolve and the second hole transport material is less likely to dissolve. Such features can increase the hole injection efficiency, and further improve the interfacial properties between the hole transport layer 4 and the light-emitting layer 3.

An example of a nonpolar solvent having a dipole moment of more than 0.2 D and 0.4 D or less is toluene (0.3 to 0.4 D). Furthermore, examples of a nonpolar solvent having a dipole moment of 0.2D or less include hexane (0.08 D), heptane (0.00 D), octane (0.00 D), and decane (0.08 D). Among these solvents, octane is particularly preferable.

The quantum-dot-dispersed solution may be prepared by any given method. An exemplary method involves the following: (i) a solvent (a solvent A) in which quantum dots are soluble is added to the first hole transport material; (ii) the obtained mixture is subjected to a known dissolving means (e.g., heating or ultrasonic waves), so that the first hole transport material is at least partially dissolved in the solvent A; (iii) the obtained mixture is subjected to a known solid-liquid separation means (e.g., filtration or centrifugal separation), so that the first hole transport material remained undissolved is removed, and the supernatant fluid (a solution X) is collected; (iv) such a substance as ethanol is added to a dispersed solution in which the quantum dots are dispersed so that the quantum dots are precipitated, and, after that, the precipitated quantum dots are subjected to a known solid-liquid separation means so that the precipitated quantum dots are collected; and (v) the quantum dots collected at (iv) is dispersed in the solution X and the solvent A so that the quantum-dot-dispersed solution is prepared to have a target quantum dot concentration and a target first hole transport material concentration.

The quantum dots 11 are a light-emitting material having a valence band level and a conduction band level and emitting light by recombination of the holes at the valence band level and the electrons at the conduction band level. The light emitted from the quantum dots 11 has a narrow spectrum because of the quantum confinement effect. Hence, relatively deep chromaticity can be obtained for the emitted light.

The quantum dots 11 may be appropriately selected from materials used in a corresponding field. Furthermore, each of the quantum dots 11 may have a core-shell structure including, for example, a core and a shell that is an outer shell of the core. In this case, the quantum dot 11 may include materials such as CdSe—CdS, CdSe—ZnS, ZnSe—ZnS, InP—ZnS, or CIGS-ZnS.

The quantum dots 11 have a particle size of approximately 2 to 15 nm. A wavelength of light emitted from the quantum dots 11 can be controlled through the particle diameter of the quantum dots 11. Hence, when the particle size of the quantum dots 11 is controlled, a wavelength of light emitted from the light-emitting element 10 can be controlled.

The first hole transport material to be used will be described later in the section of Hole Transport Layer. Hence, the description of the first hole transport material will be omitted here.

Hole Transport Layer

The hole transport layer 4 transports the holes, sent from the first electrode 1, to the light-emitting layer 3. In this embodiment, the hole transport layer 4 contains the second hole transport material. The hole transport layer 4 has a thickness of preferably 5 to 40 nm. The hole transport layer 4 can be formed by a known technique such as coating, depending on a kind of the second hole transport material.

In one embodiment, the second hole transport material is preferably non-photosensitive. Such a feature can reduce deterioration due to photosensitivity.

The first hole transport material and the second hole transport material are a combination of hole transport materials satisfying requirements (a) and (b) below, among known materials to be used as the hole transport materials:

(a) the solubility of the first hole transport material in a solvent in which the quantum dots are soluble is higher than the solubility of the second hole transport material in the solvent; and (b) the difference between the ionization potential of the first hole transport material and the ionization potential of the second hole transport material is smaller than the difference between the ionization potential of the quantum dots and the ionization potential of the second hole transport material.

In other words, the second hole transport material is selected from hole transport materials satisfying requirements (c) and (d) below, among known materials to be used as the hole transport materials:

(c) the solubility of the second hole transport material in a solvent in which the quantum dots are soluble is lower than the solubility of the first hole transport material contained in the light-emitting layer 3; and (d) the difference in ionization potential between the second hole transport material and the first hole transport material is smaller than the difference in ionization potential between the second hole transport material and the quantum dots 11.

Note that, in Description, the solubility of each of the first hole transport material and the second hole transport material in a solvent in which the quantum dots are soluble can be obtained by, for example, the method below: (i) a solvent (a solvent A) in which quantum dots are soluble is added to a specimen (the first hole transport material or the second hole transport material) at a predetermined temperature, and a saturated solution is prepared; (ii) 2 mL of the saturated solution prepared at (i) is taken into a bottle (having a weight of w1 mg) the weight of which has been previously measured with a Mettler; (iii) the saturated solution is dried; and (iv) the weight (w2 mg) of the bottle after the drying is measured with a Mettler, and a concentration of the saturated solution at the predetermined temperature is calculated using the equation below. The concentration of the saturated solution at the predetermined temperature corresponds to the solubility of the specimen at the temperature.

$$\text{A concentration of saturated solution}\left[\text{mg/mL}\right] = (w2 - w1)/2.$$

In this embodiment, the solubility of the first hole transport material in a solvent in which the quantum dots are soluble is higher than the solubility of the second hole transport material in the solvent. When the quantum-dot-dispersed solution is applied to the hole transport layer 4 to form the light-emitting layer 3, such a feature can prevent a surface of the hole transport layer 4 from dissolving by the quantum-dot-dispersed solution. This can reduce the risk that the second hole transport material in the hole transport layer 4 dissolves in the solvent of the quantum-dot-dispersed solution and enters the light-emitting layer 3, thereby successfully reducing roughness of the interface between the light-emitting layer 3 and the hole transport layer 4. Note that, in Description, when the roughness of an interface between layers is reduced and the interface is even, the state is hereinafter also simply referred to as "excellent interfacial properties". In particular, when the interfacial properties between the light-emitting layer 3 and the hole transport layer 4 are improved, an interface state capable of trapping the holes is less likely to appear at the interface between the light-emitting layer 3 and the hole transport layer 4. Such a feature can improve efficiency in injecting the holes into the light-emitting layer 3.

Furthermore, a size of a hole injection barrier against the holes to be injected from a first layer to a second layer corresponds to energy obtained by subtracting the ionization potential of the first layer from the ionization potential of the second layer. In this embodiment, the difference between the ionization potential of the first hole transport material and the ionization potential of the second hole transport material is smaller than the difference between the ionization potential of the quantum dots 11 and the ionization potential of the second hole transport material. Thus, the hole injection barrier between the second hole transport material and the first hole transport material in the light-emitting layer 3 is smaller than the hole injection barrier between the second hole transport material and the quantum dots 11 in the light-emitting layer 3. Such a feature reduces the barrier more effectively against the holes to be injected from the second hole transport material in the hole transport layer 4 into the first hole transport material in the light-emitting layer 3, thereby more effectively increasing the efficiency in injecting the holes from the hole transport layer 4 into the light-emitting layer 3. Note that, in Description, when the holes are injected with high efficiency, the state is hereinafter also simply referred to as "excellent hole transportability".

Hence, the light-emitting element 10 according to this embodiment uses a combination of hole transport materials serving as the first hole transport material and the second hole transport material and satisfying the requirements (a) and (b) (i.e., uses a hole transport material serving as the second hole transport material and satisfying the above requirements (c) and (d)). As a result, the light-emitting element 10 has an advantageous effect of simultaneously achieving excellent hole transportability and interfacial properties. The light-emitting element 10 according to this embodiment has both excellent hole transportability and excellent interfacial properties. Hence, the light-emitting element 10 can efficiently recombine together the holes transported to the light-emitting layer 3 and the electrons transported from the second electrode 2 to the light-emitting layer 3. Thanks to such a feature, the light-emitting element 10 according to this embodiment can improve the light emission efficiency of the light-emitting layer 3.

In particular, in the light-emitting element 10, if the electrons are excessively found in the light-emitting layer 3, the above feature increases the concentration of the holes in the light-emitting layer 3. Hence, the carrier balance in the light-emitting layer 3 improves. The improved carrier balance is less likely to cause a non-light-emitting process such as the Auger recombination in the light-emitting layer 3, and the light emitting layer 3 improves in light emission efficiency more efficiently.

The difference between the ionization potential of the first hole transport material and the ionization potential of the second hole transport material is preferably 0.3 eV or less, more preferably 0.2 eV or less, and still more preferably 0.1 eV or less. If the difference between the ionization potential of the first hole transport material and the ionization potential of the second hole transport material is 0.3 eV or less, a barrier can be reduced against the holes to be transported from the hole transport layer 4 to the light-emitting layer 3, so that the light-emitting element 10 can further improve in hole transportability.

Materials to be suitably used as the first hole transport material and the second hole transport material are known materials to be used as hole transport materials. Examples of the materials include polymers such as TFB and poly-TPD. Among these materials, polymers can be used particularly preferably as the first hole transport material and the second hole transport material. Such features can facilitate control for solubility of the first hole transport material and the second hole transport material in a solvent in which quantum dots are soluble, and reduce the difference between the ionization potential of the first hole transport material and the ionization potential of the second hole transport material.

If polymers are used as the first hole transport material and the second hole transport material, the first hole transport material preferably contains a first polymer, the second hole transport material preferably contains a second polymer, and the first polymer and the second polymer preferably have a common repeating unit in a main chain. Such features further reduce the difference in ionization potential between the first hole transport material and the second hole transport material, such that the light-emitting element 10 can further improve in hole transportability.

Furthermore, a weight-average molecular weight of the first polymer is preferably smaller than a weight-average molecular weight of the second polymer. Such a feature can raise the solubility of the first hole transport material in a solvent in which the quantum dots are soluble above the solubility of the second hole transport material in the solvent. As a result, the interfacial properties between the hole transport layer 4 and the light-emitting layer 3 can be improved.

The weight-average molecular weight of the first polymer is preferably smaller than the weight-average molecular weight of the second polymer, and is 20,000 or less, more preferably 17,500 or less, and still more preferably 15,000 or less. The first polymer having a weight-average molecular weight of 20,000 or less exhibits excellent solubility in a solvent in which quantum dots are soluble. Such a feature achieves an advantageous effect of facilitating preparation of a quantum-dot-dispersed solution containing the first hole transport material at a desired concentration. A lower limit value of the weight-average molecular weight of the first polymer shall not be limited to a particular value. In view of hole transportability, the lower limit value is preferably 5,000 or more, more preferably 7,500 or more, and still more preferably 10,000 or more.

The weight-average molecular weight of the second polymer may be greater than the weight-average molecular weight of the first polymer, and shall not be limited to a particular weight. In view of preventing the surface of the hole transport layer 4 from developing roughness by the quantum-dot-dispersed solution, the weight-average molecular weight of the second polymer is preferably greater than 20,000. Furthermore, the weight-average molecular weight of the second polymer is more preferably 30,000 or more, and still more preferably 40,000 or more. Moreover, an upper limit value of the weight-average molecular weight of the second polymer shall not be limited to a particular value. In view of further improving surface morphology of the second hole transport layer, the upper limit is, for example, preferably 75,000 or less, more preferably 65,000 or less, and still more preferably 45,000 or less.

The difference between the weight-average molecular weight of the first polymer and the weight-average molecular weight of the second polymer is preferably 2,500 or more, more preferably 5,000 or more, still more preferably 15,000 or more, and particularly preferably 25,000 or more. The larger the difference is between the weight-average molecular weight of the first polymer and the weight-average molecular weight of the second polymer, the easier the prevention is of the roughness developed on the surface of the hole transport layer 4 by the quantum-dot-dispersed solution, and the easier the preparation is of the quantum-dot-dispersed solution containing the first hole transport material at a desired concentration.

Note that the weight-average molecular weights of the first polymer and the second polymer can be obtained by a measurement technique utilizing, for example, the gel permeation chromatography.

In view of further improving the hole transportability and the interfacial properties, both the first polymer and the second polymer are particularly preferably either TFB or poly-TPD. Thanks to such a feature, the first polymer and the second polymer have a common repeating unit in a main chain. Hence, the ionization potentials of the first polymer and the second polymer are substantially equal, and the light-emitting element 10 can further improve in hole transportability.

Furthermore, the inventors of the disclosure have found out that (i) a TFB and a poly-TPD having a low molecular weight (e.g., having a weight-average molecular weight of 20,000 or less) exhibit moderate solubility in a solvent in which quantum dots are soluble (e.g., a nonpolar solvent such as octane), and (ii) a TFB and a poly-TPD having a high molecular weight (e.g., having a weight average molecular weight of more than 20,000) exhibit insolubility in the aforementioned solvent.

As an example, a TFB having a weight-average molecular weight of 5,000 to 20,000 exhibits a solubility of approximately 0.15 mg/mL in octane having a temperature of 20 to 25° C.; whereas, a TFB having a weight-average molecular weight of 30,000 or more exhibits insolubility in the octane.

Hence, a TFB or a poly-TPD having a low molecular weight (for example, a weight-average molecular weight of 20,000 or less) is used as the first polymer, and a TFB or a poly-TPD having a higher molecular weight than the first polymer is used as the second polymer. Such features can further improve the interfacial properties between the hole transport layer 4 and the light-emitting layer 3.

Furthermore, because TFB or poly-TPD is a non-photosensitive polymer, TFB or poly-TPD has an advantageous effect of successfully reducing photodegradation due to photosensitization.

TFB includes: poly [(9,9-dioctylfluorenyl-2,7-diyl)-co-(4,4'-(N-(4-butylphenyl) diphenylamine)))] (CAS Registry No. 223569-31-1); and poly [(9,9-dioctylfluorenyl-2,7-diyl)-co-(4,4'-(N-(4-sec-butylphenyl) diphenylamine))] (CAS Registry No. 220797-16-0).

Poly-TPD (CAS Registry No. 472960-35-3) is also referred to as poly(4-butyl-N,N-diphenylaniline), poly(4-butyltriphenylamine), or poly[N,N'-bis(4-butylphenyl)-N,N'-bis(phenyl)-benzidine].

In a preferred embodiment, the first polymer has a substituted or an unsubstituted C4 to C20 alkyl group serving as a side chain bonding directly or indirectly to the main chain. Such a feature can improve the solubility of the first hole transport material (the first polymer) in a solvent (e.g., a nonpolar solvent) in which quantum dots are soluble, such that the first polymer can be efficiently dissolved in the solvent.

The substituted or unsubstituted C4 to C20 alkyl group is a linear, branched, or cyclic alkyl group having 4 to 20 carbon atoms. The alkyl group may have a substituent or may be unsubstituted. Examples of the substituent include a halogen atom, a cyano group, and a hydroxy group.

If the first polymer has a substituted or an unsubstituted C4 to C20 alkyl group serving as a side chain indirectly bonding to the main chain, the side chain can bond to the main chain through a divalent linking group. The divalent linking group shall not be limited to a particular one. Examples of such divalent linking group include a ketone group and an imino group.

Electron Transport Layer

Figure 2:
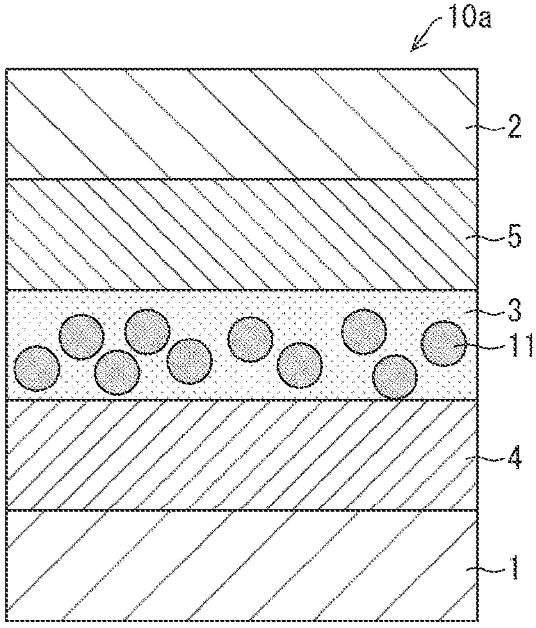
FIG. 2 is a schematic cross-sectional view of a modification of the light-emitting element according to the first embodiment of the disclosure.

Hence, in this embodiment, as illustrated in FIG. 2, the light-emitting layer 10 may include an electron transport layer 5 between the light-emitting layer 3 and the second electrode 2. In this case, the second electrode (the cathode) 2 is electrically connected to the electron transport layer 5.

The electron transport layer 5 transports the electrons, sent from the second electrode 2, to the light-emitting layer 3. The electron transport layer 5 may be made of $TiO_2$. Otherwise, the electron transport layer 5 may be made of an organic or an inorganic material used for light-emitting elements containing quantum dots or for organic EL light-emitting elements. As the organic material of the electron transport layer 5, a conductive compound such as $Alq_3$, BCP, or t-Bu-PBD can be used. As the inorganic material of the electron transport layer 5, a metal oxide such as ZnO, ZAO, ITO, IGZO or electride can be used. The electron transport layer 5 can be formed of the above materials by vacuum evaporation or sputtering, or of a colloidal solution by coating. The electron transport layer 5 may contain nanoparticles, crystals, polycrystals, or amorphous. The electron transport layer 5 has a known thickness of preferably 10 to 100 nm.

Other Layers

Furthermore, the light-emitting element 10 may include a hole injection layer (not shown) between the first electrode 1 and the hole transport layer 4, in order to efficiently inject the holes from the first electrode 1 to the hole transport layer 4. Moreover, the light-emitting element 10 may include an electron injection layer (not shown) between the second electrode 2 and the electron transport layer 5, in order to efficiently inject the electrons from the second electrode 2 to the electron transport layer 5. Both the hole injection layer and the electron injection layer may be formed by the same method as that for forming the hole transport layer 4 or the electron transport layer 5.

Second Embodiment

Figure 3:
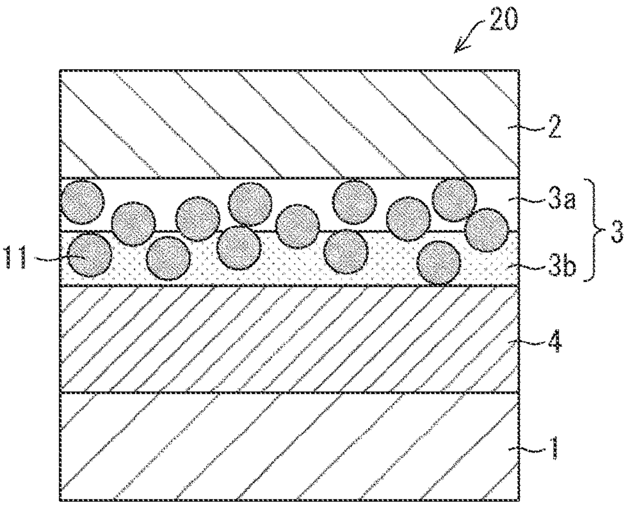
FIG. 3 is a schematic cross-sectional view of a light-emitting element according to a second embodiment of the disclosure.

FIG. 3 is a schematic cross-sectional view of a light-emitting element 20 according to this embodiment.

Compared with the light-emitting element 10 according to the first embodiment, in the light-emitting element 20 according to this embodiment illustrated in FIG. 3, the light-emitting layer 3 at least partially has a concentration gradient in which a concentration of the first hole transport material increases from toward the second electrode 2 to toward the hole transport layer 4. Otherwise, the light-emitting element 20 according to this embodiment is the same in configuration as the light-emitting element 10 according to the first embodiment. In the light-emitting element 20, the light-emitting layer 3 may include a plurality of layers having different concentrations of the first hole transport material. In at least a portion of the plurality of layers, the concentration of the first hole transport material sequentially increases from toward the second electrode to toward the hole transport layer 4.

Thanks to the increase in concentration, the hole transportability of the light-emitting layer 3 toward the hole transport layer 4 can be increased higher than the hole transportability of the light-emitting layer 3 toward the second electrode 2. Such a feature can keep the holes, transported from the hole transport layer 4 into the light-emitting layer 3, from moving out toward the second electrode 2, and recombining with the electrons out of the light-emitting layer 3, or deactivating, thereby successfully increasing light emission efficiency.

In the light-emitting element 20, the concentration gradient of the first hole transport material may increase sequentially from the surface of the light-emitting layer 3 toward the second electrode 2 to the surface of the light-emitting layer 3 toward the hole transport layer 4 over the entire thickness of the light-emitting layer 3. Alternatively, in the light-emitting element 20, the concentration gradient of the first hole transport material may increase sequentially in a portion near the center of the light-emitting layer 3 toward the hole transport layer 4.

In one embodiment, the light-emitting layer 3 of the light-emitting element 20 may include: a layer **3*a* positioned toward the second electrode 2 and containing no first hole transport material; and a layer 3*b* positioned toward the hole transport layer 4 and containing the first hole transport material. Such a feature can reduce emission of light and defect traps out of the light-emitting layer 3, thereby raise the concentration of the holes near the center of the light-emitting layer 3**, and, as a result, successfully increasing light emission efficiency.

The light-emitting layer 3 having the concentration gradient may be formed by any given method. An exemplary method involves the following: (i) a quantum-dot-dispersed solution, in which the plurality of quantum dots 11 and the first hole transport material are dispersed in a solvent, is applied to the hole transport layer 4 to form the light-emitting layer 3 having no concentration gradient; and (ii) a surface of the light-emitting layer 3 having no concentration gradient is immersed in a solvent (e.g., propyleneglycol 1-monomethylether 2-acetate (PGMEA)) in which the quantum dots 11 are insoluble and the first hole transport material is soluble, so that the first hole transport material is partially eluted into the solvent.

Third Embodiment

A display device according to this embodiment includes a plurality of the light-emitting elements 10 and 20 according to the first and second embodiments. The light-emitting elements 10 and 20 are provided on a substrate. The display device according to this embodiment has an advantageous effect of high light emission efficiency, because the light-emitting elements 10 and 20 excel in hole transportability and interfacial properties.

Figure 4:
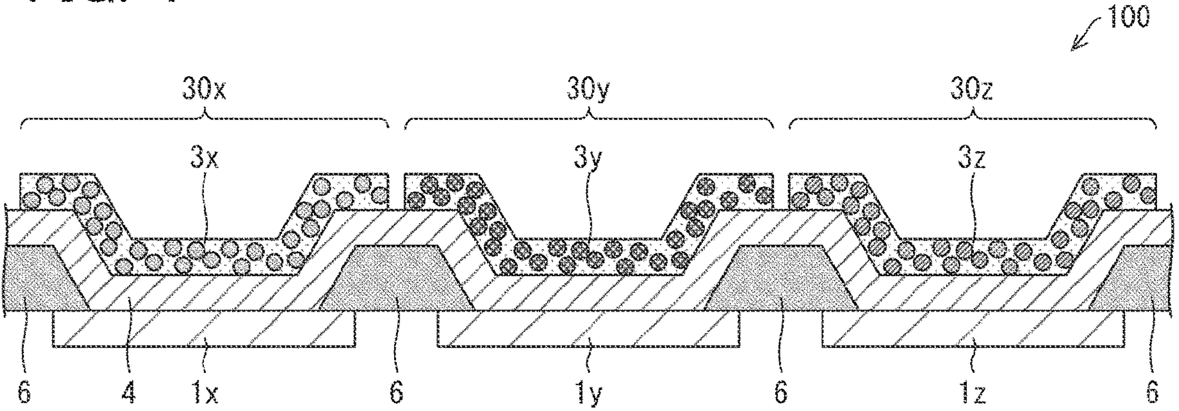
FIG. 4 is a schematic cross-sectional view of a light-emitting device according to a third embodiment of the disclosure.

FIG. 4 is a schematic cross-sectional view of an example of the display device according to this embodiment. Note that, like names and reference signs designate members with identical or corresponding functions throughout Description. Such members shall not be elaborated upon repeatedly unless otherwise different in configuration.

As illustrated in FIG. 4, a display device 100 includes: a red-subpixel light-emitting element 30*x*; a green-subpixel light-emitting element 30*y*; and a blue-subpixel light-emitting element 30*z*.

As seen in the light-emitting elements 10 and 20 according to the first and second embodiments, each of the red-subpixel light-emitting element 30*x*, the green-subpixel light-emitting element 30*y*, and the blue-subpixel light-emitting element 30*z* includes: the hole transport layer 4; the light-emitting element 3; and a second electrode (not-shown), all of which are provided upwards in the stated order above the first electrode 1. The first electrode 1 and the light-emitting layer 3 are formed for each of the subpixels, and the hole transport layer 4 is formed in common to the subpixels.

The red-subpixel light-emitting element 30*x* includes a red light-emitting layer 3*x* containing: red light-emitting quantum dots; and the first hole transport material. Furthermore, the green-subpixel light-emitting element 30*y* includes a green light-emitting layer 3*y* containing: green light-emitting quantum dots; and the first hole transport material. Moreover, the blue-subpixel light-emitting element 30*z* includes a blue light-emitting layer 3*z* containing: blue light-emitting quantum dots; and the first hole transport material.

Here, a red light has a center wavelength in a wavelength band of, for example, more than 600 nm and 780 nm or less. Furthermore, a green light has a center wavelength in a wavelength band of, for example, more than 500 nm and 600 nm or less. Moreover, a blue light has a center wavelength in a wavelength band of, for example, 400 nm or more and 500 nm or less.

In this embodiment, an edge cover 6 is provided between: the first electrodes 1*x*, 1*y*, and 1*z*; and the hole transport layer 4, in order to separate the light-emitting elements 30*x*, 30*y*, and 30*z* from one another. Such a feature can increase light emission efficiency for all of the pixels in red, green and blue. Furthermore, typically, an electric field is likely to concentrate near an end portion of an electrode of a light-emitting element. Hence, the edge cover 6 covers peripheral end portions of the first electrodes 1*x*, 1*y*, and 1*z*, thereby successfully reducing influence of the electric field concentration on the peripheral end portions of the first electrodes 1*x*, 1*y*, and 1*z* for the respective light-emitting layers of the light-emitting elements 30*x*, 30*y*, and 30*z*.

In the display device 100, a group including one each of the red-subpixel light-emitting element 30*x*, the green-subpixel light-emitting element 30*y*, and the blue-subpixel light-emitting element 30*z* may be one pixel in the display device 100. Although only one pixel is illustrated in FIG. 4, the display device 100 may include a plurality of pixels in addition to the pixel.

Method for Manufacturing Display Device 100

A method for manufacturing the display device 100 according to this embodiment is carried out as an example below: (i) the hole transport layer 4 containing the second hole transport material is applied and formed on a substrate on which the first electrodes 1*x*, 1*y*, and 1*z*, and the edge cover 6 are formed, so as to cover all the first electrodes 1*x*, 1*y*, and 1*z*; (ii) a quantum-dot-dispersed solution containing red light-emitting quantum dots and the first hole transport material is applied, and the red light-emitting layer 3*x* is patterned by a lift-off technique; (iii) a quantum-dot-dispersed solution containing green light-emitting quantum dots and the first hole transport material is applied, and the green light-emitting layer 3*y* is patterned by a lift-off technique; (iv) a quantum-dot-dispersed solution containing blue light-emitting quantum dots and the first hole transport material is applied, and the blue light-emitting layer 3*z* is patterned by a lift-off technique; and (v) the electron transport layer 5 is formed if necessary, and then, the second electrode 2 is formed. Through the above steps, the display device 100 according to this embodiment is successfully manufactured.

The display device 100 according to this embodiment includes the red-subpixel light-emitting element 30*x*, the green-subpixel light-emitting element 30*y*, and the blue-subpixel light-emitting element 30*z*. Hence, the light-emitting elements of the respective subpixels are individually driven so that light can be emitted in various colors.

Fourth Embodiment

Figure 5:
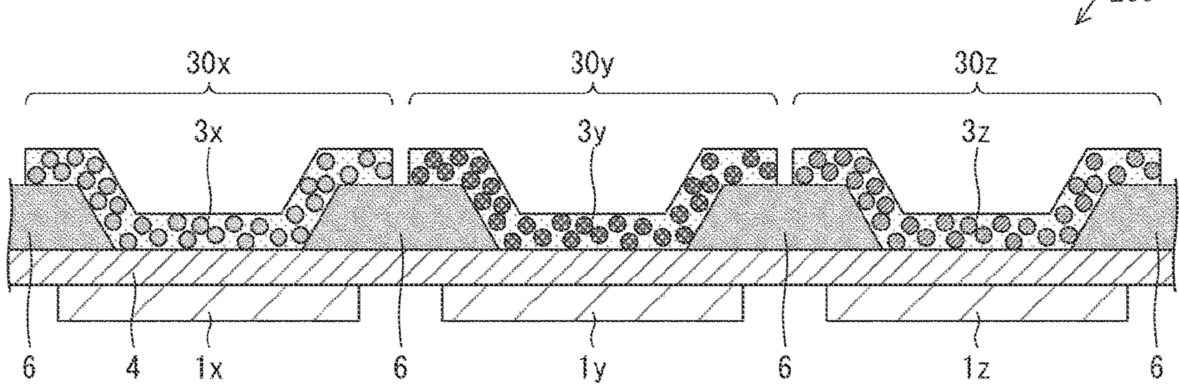
FIG. 5 is a schematic cross-sectional view of a light-emitting device according to a fourth embodiment of the disclosure.

FIG. 5 is a schematic cross-sectional view of a display device 200 according to this embodiment.

Compared with the display device 100 according to the third embodiment, the display device 200 according to this embodiment as illustrated in FIG. 5 includes the edge cover 6 between: the hole transport layer 4; and the light-emitting layers 3*x*, 3*y*, and 3*z*, in order to separate the light-emitting elements 30*x*, 30*y*, and 30*z* from one another. Otherwise, the display device 200 according to this embodiment may be the same in configuration as the display device 100 according to the third embodiment.

Such a feature can increase light emission efficiency for all of the pixels in red, green, and blue. Furthermore, the feature makes it possible to make the film thickness of the hole transport layer 4 uniform, thereby successfully keeping a current from concentrating in a pixel, and emitting light uniformly.

Method for Manufacturing Display Device 200

A method for manufacturing the display device 200 according to this embodiment is carried out as an example below: (i) the hole transport layer 4 containing the second hole transport material is applied and formed on a substrate on which the first electrodes 1*x*, 1*y*, and 1*z* are formed, so as to cover all the first electrodes 1*x*, 1*y*, and 1*z*; (ii) the edge cover 6 is formed by photolithography; (iii) a quantum-dot-dispersed solution containing red light-emitting quantum dots and the first hole transport material is applied, and the red light-emitting layer 3*x* is patterned by a lift-off technique; (iv) a quantum-dot-dispersed solution containing green light-emitting quantum dots and the first hole transport material is applied, and the green light-emitting layer 3*y* is patterned by a lift-off technique; (v) a quantum-dot-dispersed solution containing blue light-emitting quantum dots and the first hole transport material is applied, and the blue light-emitting layer 3*z* is patterned by a lift-off technique; and (vi) the electron transport layer 5 is formed if necessary, and then, the second electrode 2 is formed. Through the above steps, the display device 200 according to this embodiment is successfully manufactured.

The present disclosure shall not be limited to the embodiments described above, and can be modified in various manners within the scope of claims. The technical aspects disclosed in different embodiments are to be appropriately combined together to implement another embodiment. Such an embodiment shall be included within the technical scope of the present disclosure. Moreover, the technical aspects disclosed in each embodiment may be combined together to achieve a new technical feature.

The invention claimed is:

1. A light-emitting element, comprising:

a first electrode;

a second electrode;

a light-emitting layer positioned between the first electrode and the second electrode, and containing a plurality of quantum dots and a first hole transport material; and a hole transport layer positioned between the first electrode and the light-emitting layer, and containing a second hole transport material, wherein:

a solubility of the second hole transport material to a solvent, in which the plurality of quantum dots is soluble, is lower than a solubility of the first hole transport material to the solvent, a difference in ionization potential between the second hole transport material and the first hole transport material is smaller than a difference in ionization potential between the second hole transport material and the plurality of quantum dots, the first hole transport material contains a first polymer, the second hole transport material contains a second polymer, and the first polymer and the second polymer have a common repeating unit in a main chain, a weight-average molecular weight of the first polymer is smaller than a weight-average molecular weight of the second polymer, and the solvent is a nonpolar solvent having a dipole moment of 0.4 D or less.

2. The light-emitting element according to claim 1, wherein the difference in the ionization potential between the first hole transport material and the second hole transport material is 0.3 eV or less.

3. The light-emitting element according to claim 1, wherein the first polymer has a substituted or an unsubstituted C4 to C20 alkyl group serving as a side chain bonding directly or indirectly to the main chain.

4. The light-emitting element according to claim 1, wherein the weight-average molecular weight of the first polymer is in a range of 20,000 or less.

5. The light-emitting element according to claim 1, wherein both the first polymer and the second polymer are either TFB or poly-TPD.

6. The light-emitting element according to claim 1, wherein the second hole transport material is non-photosensitive.

7. The light-emitting element according to claim 1, wherein, in the light-emitting layer, a content of the plurality of quantum dots is larger than a content of the first hole transport material.

8. The light-emitting element according to claim 1, wherein the light-emitting layer, at least partially, has a concentration gradient in which a concentration of the first hole transport material increases from the second electrode toward the hole transport layer.

9. A display device comprising a plurality of light-emitting elements, including the light-emitting element according to claim 1, wherein the plurality of light-emitting elements is provided on a substrate.

10. The display device according to claim 9, further comprising:

an edge cover provided between the first electrode and the hole transport layer both included in at least two light-emitting elements of the plurality of light-emitting elements, in order to separate the at least two light-emitting elements from one another.

11. The display device according to claim 9, further comprising:

an edge cover provided between the hole transport layer and the light-emitting layer, wherein both hole transport layer and the light-emitting layer are included in each of at least two light-emitting elements of the plurality of light-emitting elements, in order to separate the at least two light-emitting elements from one another.

12. The light-emitting element according to claim 1, wherein the solvent includes one or more solvents selected from a group consisting of octane, toluene, hexane, tetradecane, and cyclododecane.

13. The light-emitting element according to claim 1, wherein the solvent includes octane.

14. The light-emitting element according to claim 1, wherein both the first polymer and the second polymer are either TFB or poly-TPD, and the solvent includes one or more solvents selected from a group consisting of octane, toluene, hexane, tetradecane, and cyclododecane.

15. A method for manufacturing a light-emitting element, the method comprising:

applying a quantum-dot-dispersed solution, in which a plurality of quantum dots and a first hole transport material are dispersed in a solvent, to a hole transport layer containing a second hole transport material, and depositing a light-emitting layer, wherein a difference in ionization potential between the first hole transport material and the second hole transport material is smaller than a difference in ionization potential between the plurality of quantum dots and the second hole transport material, and a solubility of the first hole transport material in the solvent is higher than a solubility of the second hole transport material in the solvent, the first hole transport material contains a first polymer, the second hole transport material contains a second polymer, and the first polymer and the second polymer have a common repeating unit in a main chain, a weight-average molecular weight of the first polymer is smaller than a weight-average molecular weight of the second polymer, and the solvent is a nonpolar solvent having a dipole moment of 0.4 D or less.

* * * * *